(12) United States Patent
Morvan et al.

(10) Patent No.: US 9,147,750 B2
(45) Date of Patent: Sep. 29, 2015

(54) PROCESS FOR FABRICATING A TRANSISTOR COMPRISING NANOSCALE SEMICONDUCTOR FEATURES USING BLOCK COPOLYMERS

(71) Applicant: COMMISSARIAT A L'ENERGIE ATOMIQUE ET AUX ENERGIES ALTERNATIVES, Paris (FR)

(72) Inventors: Simeon Morvan, Grenoble (FR); Francois Andrieu, Grenoble (FR); Raluca Tiron, Saint-Martin-le-Vinoux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 13/902,793

(22) Filed: May 25, 2013

(65) Prior Publication Data

US 2013/0323888 A1   Dec. 5, 2013

(30) Foreign Application Priority Data

May 30, 2012   (FR) ...................... 12 54960

(51) Int. Cl.
*H01L 21/00* (2006.01)
*H01L 29/66* (2006.01)
(Continued)

(52) U.S. Cl.
CPC ...... *H01L 29/66568* (2013.01); *H01L 21/0337* (2013.01); *H01L 21/3086* (2013.01); *H01L 29/66545* (2013.01); *H01L 29/66795* (2013.01)

(58) Field of Classification Search
CPC ............ H01L 29/66545; H01L 29/785; H01L 29/66795; H01L 2924/0002; H01L 29/517; H01L 29/78; H01L 29/7833; H01L 29/7848; H01L 2924/00; H01L 21/845; H01L 29/66636; H01L 29/165; H01L 29/4966
See application file for complete search history.

(56) References Cited

U.S. PATENT DOCUMENTS

2003/0042527 A1 * 3/2003 Forbes et al. .................. 257/315
2003/0062567 A1 * 4/2003 Zheng et al. .................. 257/316
(Continued)

FOREIGN PATENT DOCUMENTS

WO   2011074852 A1   6/2011
WO   2011094597 A2   8/2011

OTHER PUBLICATIONS

Li-Wen Chang, et al., "Top-Gated FETs/Inverters with Diblock Copolymer Self-Assembled 20 nm Contact Holes", IEDM, 2009, pp. 36.3.1 thru 36.3.4, IEEE.

(Continued)

*Primary Examiner* — Robert Bachner
(74) *Attorney, Agent, or Firm* — Baker & Hostetler LLP

(57) ABSTRACT

A process for fabricating one transistor, comprising a semiconductor region, comprising a source region, a drain region, and a channel region covered with a gate, comprises: production of an primary etching mask on the surface of the semiconductor region, said mask containing at least one primary aperture; depositing in said primary aperture a block copolymer containing, in alternation, at least first polymer domains and second polymer domains; removing either a series of first polymer domains or a series of second polymer domains in order to create a secondary mask containing secondary apertures; etching said active region through said secondary apertures in order to define nanoscale self-aligned semiconductor features; producing said gate on the surface of said self-aligned semiconductor features.

16 Claims, 10 Drawing Sheets

(51) Int. Cl.
*H01L 21/033* (2006.01)
*H01L 21/308* (2006.01)

(56) References Cited

U.S. PATENT DOCUMENTS

| | | |
|---|---|---|
| 2006/0249784 A1 | 11/2006 | Black et al. |
| 2007/0224819 A1 | 9/2007 | Sandhu |
| 2007/0281405 A1* | 12/2007 | Luo et al. ............ 438/183 |
| 2008/0164558 A1 | 7/2008 | Yang et al. |
| 2008/0211981 A1* | 9/2008 | Sonoda et al. ........ 349/46 |
| 2009/0026543 A1 | 1/2009 | Yang |
| 2011/0081777 A1 | 4/2011 | Yoon et al. |
| 2011/0117744 A1* | 5/2011 | Ito ..................... 438/702 |

OTHER PUBLICATIONS

Li-Wen-Chang, et al., "Experimental Demonstration of Aperiodic Patterns of Directed Self-Assembly by Block Copolymer Lithography for Random Logic Circuit Layout", IEDM, 2010, pp. 33.2.1 thru 33.2.4, IEEE.

Thomas Skotnicki, "Transistor MOS et sa technologie de fabrication", Les Techniques de L'Ingenieur, Traite Electronique, Chapter 4.1.10, pp. E2 430-1 thru E2 430-37.

* cited by examiner

PROCESS FOR FABRICATING A TRANSISTOR COMPRISING NANOSCALE SEMICONDUCTOR FEATURES USING BLOCK COPOLYMERS

CROSS-REFERENCE TO RELATED APPLICATION

This application claims priority to foreign French patent application No. FR 1254960, filed on May 30, 2012, the disclosure of which is incorporated by reference in its entirety.

FIELD OF THE INVENTION

The field of the invention is that of semiconductor components and technologies allowing features of very small size to be defined in order to allow components, such as transistors for example and possibly FDSOI transistors i.e. fully depleted transistors, to be produced.

BACKGROUND

An example of an FDSOI transistor is illustrated in FIG. 1. This type of transistor is produced on an SOI (acronym for silicon-on-insulator) substrate having a structure consisting of a stack of a silicon layer (a few nm to a few tens of nm in thickness) on a dielectric, possibly silicon dioxide, layer forming a buried dielectric layer commonly referred to as a "BOX". The SOI substrate thus comprises a silicon substrate 1, the buried BOX layer 2 and a layer of a semiconductor such as silicon, for example, in which a channel 3, a source region 4 and a drain region 5 are produced. The channel 3 is covered with a gate dielectric 6 on which the gate 7 is deposited.

Regarding this type of component, it is more and more difficult and expensive to obtain small features using conventional optical lithography.

A number of solutions have been envisaged for future technology nodes:
 preserving the same lithography technique but reducing the wavelengths used (extreme UV technology, etc.);
 employing one or more electron beams; and
 employing what is called a "double patterning" technique using, for example, spacers as a mask so as to double the feature density as illustrated by the series of different process steps illustrated in FIGS. 2a to 2e, showing successive lithography operations for producing, in various layers $C_1$ and $C_2$ features of smaller and smaller size, $M_{1i}$ and $M_{2j}$, respectively.

It has already been proposed to use what are called block copolymers. Under certain conditions (molar mass ratio, size and passivation of the cavities) block copolymers (BCPs) may organise into strips formed alternately by monomers of type A and B, as shown in FIG. 3a. By removing only one (type B) of the two types of block, is possible to use the remaining block (type A) as an etching mask, as illustrated in FIG. 3b. Dense features $M_{3k}$ of the size of the blocs are then transferred into the material of the subjacent layer $C_3$.

This type of structure is notably described in patent WO 2011/74852 A1 enabling conductive nanostructures to be defined by removing, in succession, a first series of blocks, then a second series of blocks, or indeed even in patent applications US 2011/0117744 A1 or US 2011/0081777 A1.

Certain scientific publications also disclose processes allowing the features of transistor structures to be produced, notably the articles of L.-W. Cheng et al. "Top-gated FETs/inverters with diblock copolymer self-assembled 20 nm contact holes" *IEDM*, pages 1-4, 2009; or indeed even that of L.-W. Cheng et al. "Experimental demonstration of aperiodic patterns of directed self-assembly by block copolymer lithography for random logic circuit layout" *IEDM*, pages 33.2.1-33.2.4, 2010. In this publication the copolymers self assemble to form holes that are 18 nm in diameter. These holes are filled with platinum in order to create contacts. The electrical performance of a CMOS inverter produced using this technique is also reported.

SUMMARY OF THE INVENTION

In this context, the Applicant provides a novel process allowing an original semiconductor structure to be obtained, which structure comprises self-aligned semiconductor features that are very small in size. Advantageously, this type of process allows transistors incorporating what are called "Tri-Gates" (because they are defined in three dimensions) to be produced, notably by virtue of the use of block copolymers (BCPs), and better electrostatic control and a smaller footprint to be obtained.

More precisely, the subject of the invention is a process for fabricating a least one transistor comprising an active semiconductor region on or in a substrate, said active semiconductor region comprising a source region, a drain region, and a channel region covered with a gate, making it possible for a current to flow between the source region and the drain region in a first direction X, characterized in that it comprises:
 the production of a primary etching mask on the surface of the semiconductor region, said mask containing at least one primary aperture of dimensions Lx and Ly in a plane defined by a first direction X and by a second direction Y parallel to the plane of said semiconductor region;
 depositing in said primary aperture a block copolymer containing, in alternation, at least first polymer domains (A) and second polymer domains (B), said first and second polymer domains having dimensions $L_x$ and $L_{yA}$ and $L_x$ and $L_{yB}$, respectively, the dimensions $L_{yA}$ and $L_{yB}$ being nanoscale dimensions;
 removing either a series of first polymer domains or a series of second polymer domains in order to create a secondary mask containing secondary apertures distributed in the second direction Y;
 etching said active region through said secondary apertures in order to define nanoscale self-aligned semiconductor features of dimensions $L_x$ and $L_{yA}$ or $L_x$ and $L_{yB}$ in the channel region in the second direction Y, said features being distributed along said second direction Y; and
 producing said gate on the surface of said self-aligned semiconductor features.

According to one variant of the invention, production of the primary mask comprises the following steps:
 producing at least one primary feature on the surface of said active region;
 producing dielectric spacers making contact with said primary feature; and
 removing said primary feature with an etch that is selective over the dielectric spacers, said dielectric spacers defining said primary mask containing said at least said primary aperture.

According to one variant of the invention, the active region is made of silicon, or of silicon-germanium, or of germanium, or of a III-V material that is possibly InGaAs or InAs.

According to one variant of the invention, the active region is produced in a semiconductor layer that is possibly made of silicon, located on the surface of an oxide layer on the surface of a substrate that is possibly made of silicon.

According to one variant of the invention, the active region is produced in a bulk semiconductor substrate.

According to one variant of the invention, the copolymer is a diblock copolymer composed of polystyrene (PS) and polymethyl methacrylate (PMMA).

According to one variant of the invention, the process comprises a step of depositing one or more gate oxides, one gate oxide of which may be deposited conformally on said semiconductor features.

According to one variant of the invention, the process comprises depositing a metal gate layer on the gate oxide, on said self-aligned semiconductor features in the channel region.

According to one variant of the invention, the process comprises depositing a thick conductive material, possibly a metal or polysilicon, on the surface of said metal gate layer.

According to one variant of the invention, the process comprises:
depositing gate oxide on said active region in line with said channel region;
producing at least one primary feature on the surface of said active region;
producing dielectric spacers making contact with said primary feature; and
removing said primary feature with an etch that is selective over the dielectric spacers, said dielectric spacers defining said primary mask containing at least one primary aperture, said primary aperture being located above said gate oxide.

According to one variant of the invention, the process comprises removing said gate oxide and subsequently depositing a conformal gate oxide on said self-aligned semiconductor features.

Thus, it is possible to produce the gate oxide in a number of ways and notably:
the oxide may be deposited at the start of the process on the active region;
the gate oxide may be conformally deposited on the self-aligned nanoscale features and the oxide produced beforehand; and
the oxide deposited beforehand may be removed, a conformal gate oxide may then be deposited.

According to one variant of the invention, the process comprises a step of defining said active region, which region is intended to correspond to the source region, channel region and drain region taken together, by etching a bulk semiconductor substrate or a semiconductor layer on the surface of an oxide layer (BOX) on the surface of a substrate.

According to one variant of the invention, the process comprises producing zones (STI) of insulating material—in order to define said semiconductor region comprising the source region, the drain region and the covered self-aligned semiconductor features—in a semiconductor substrate or in a semiconductor layer on the surface of an oxide layer (BOX) on the surface of a substrate.

According to one variant of the invention, said primary feature is removed by chemical etching.

According to one variant of the invention, the process comprises depositing a layer of insulating material coating the source region, the drain region and the covered self-aligned semiconductor features.

According to one variant of the invention, the process furthermore comprises producing a series of individual electrical contact pads or a linear electrical contact array through said layer of insulating material, said contact pads or said linear contact array allowing contact to be made to the sources and drains and said self-aligned semiconductor features to be controlled.

BRIEF DESCRIPTION OF THE DRAWINGS

The invention will be better understood and other advantages will become apparent on reading the following nonlimiting description, and by virtue of the appended Figures, in which.

DETAILED DESCRIPTION

The Applicant provides an original process allowing the advantages of block copolymers to be exploited to produce nanoscale semiconductor features. This type of feature may in particular advantageously be incorporated in an FDSOI CMOS process flow, specifically allowing, as will be explained in greater detail below, very small and particularly well isolated channel and gate elements to be defined. As used herein, the term "features" or "semiconductor features" can be, as a non-limiting example, a pattern or patterns.

Block copolymers in particular allow very small features to be obtained with a high density, these features self aligning. In the present invention, block copolymers may advantageously be used as etching masks to define "fingers" between the source and drain in the active region of transistors for advanced technology nodes (smaller than 22 nm). The transistors thus formed are "Tri-Gate" transistors: they have better electrostatic control and a smaller footprint.

It has notably been demonstrated in various publications that a diblock copolymer incorporating a polystyrene (PS) compound and polymethyl methacrylate (PMMA) allows a PS/PMMA microphase to be obtained, which microphase can be structured into an ordered nanoscale network using appropriate anneal conditions.

Thus, by selectively removing the PMMA blocks and preserving the PS blocks a network of strips can be defined spaced apart by a distance of about ten nanometres.

The present invention thus proposes to use these advantageous properties and multiple masks to define very small self-aligned semiconductor features in a trench defined beforehand.

Without constituting a restriction on the envisageable applications, the present invention will be described below in the context of an example of a process for fabricating an FDSOI transistor.

Example of a Process for Fabricating an FDSOI Transistor According to the Invention:

All of the steps are illustrated by virtue of FIGS. 4a to 4m.

Figure 1:
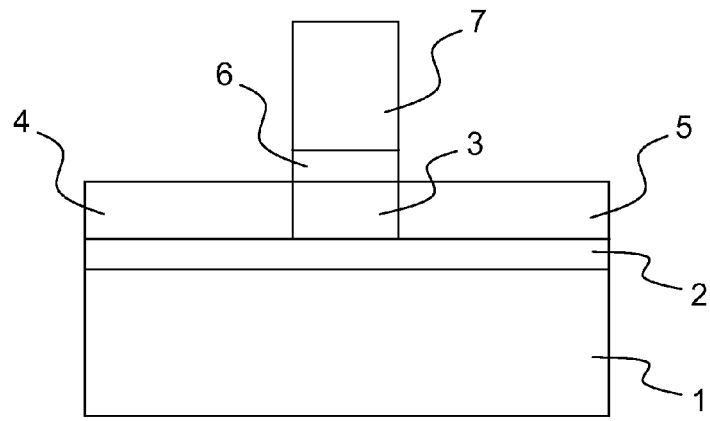
FIG. 1 illustrates a schematic of an FDSOI transistor.
Figure 2A:
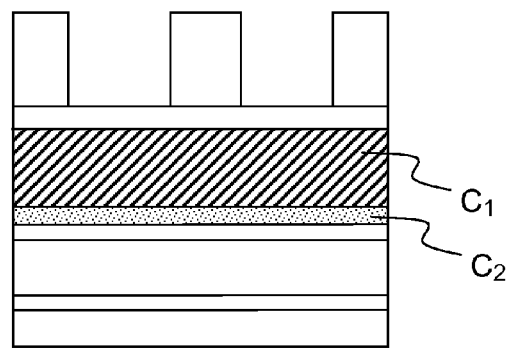
FIGS. 2a to 2e illustrate the various steps of a known prior-art process allowing small features to be obtained.
Figure 2B:
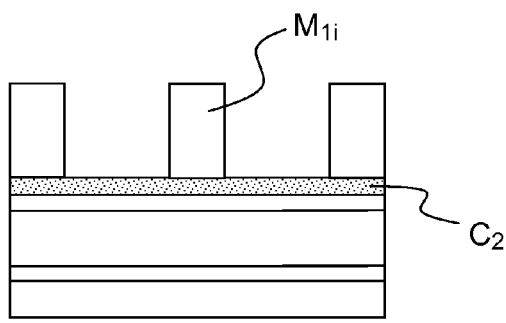
Figure 2C:
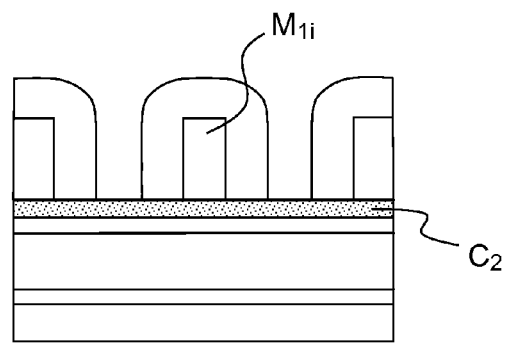
Figure 2D:
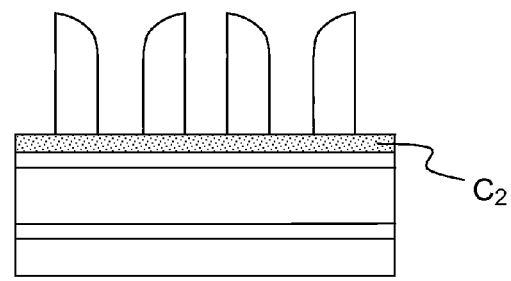
Figure 2E:
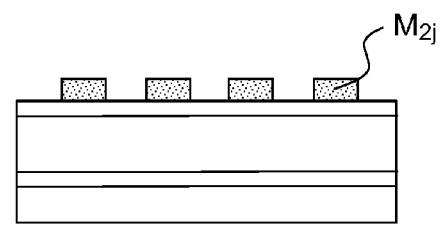
Figure 3A:
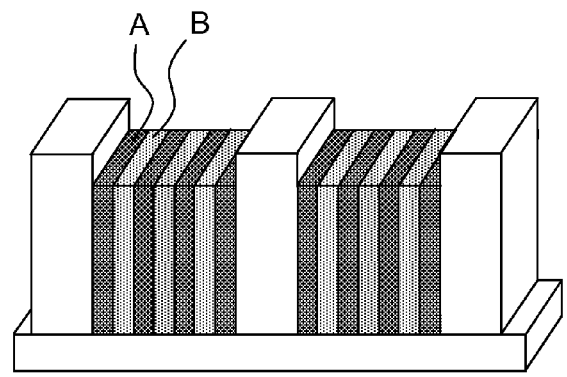
FIGS. 3a and 3b relate to the use of block copolymer and to the various processing steps that may be carried out on a block copolymer according to the prior art.
Figure 3B:
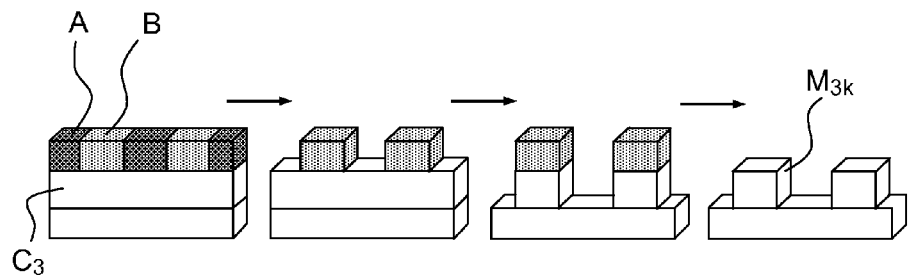
Figure 4A:
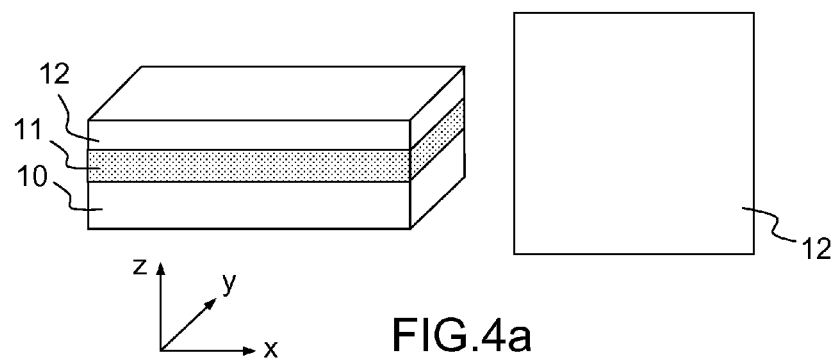
FIGS. 4a to 4m illustrate the various steps of an example of a process according to the invention allowing FDSOI transistors of very small size to be obtained and FIG. 4n illustrates a variant of FIG. 4m.
Figure 4B:
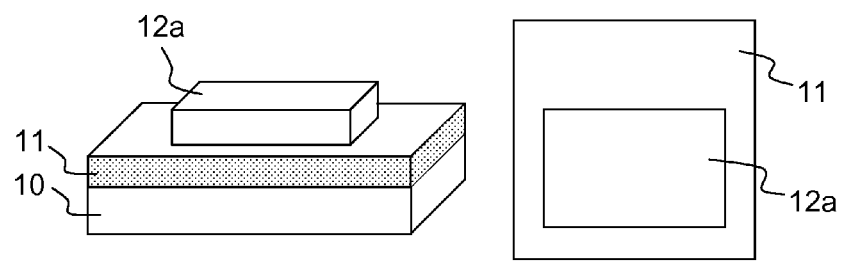

Starting with an SOI substrate, illustrated in FIG. 4a and comprising a bulk substrate 10, a buried oxide layer 11 called a BOX, and a thin silicon layer 12, an active region 12a is defined in the SOI assembly in a plane defined by the two directions X and Y perpendicular to a direction Z, as shown in FIG. 4b.

Figure 4C:
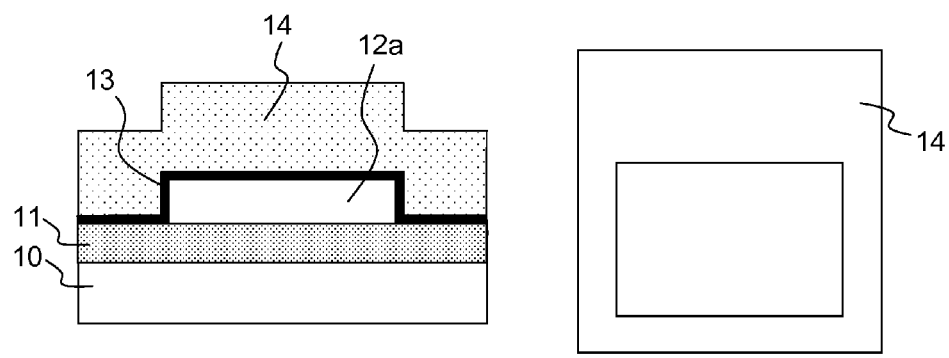

According to the present variant, and as illustrated in FIG. 4c, a thin oxide layer 13 is deposited, typically this layer may be made of $SiO_2$ or of $HfO_2$ or of any other oxide, then a layer 14 made of a material having a good chemical etching selectivity over other materials, as will be explained in more detail further on in the present description, is deposited, this material possibly typically being polysilicon.

Figure 4D:
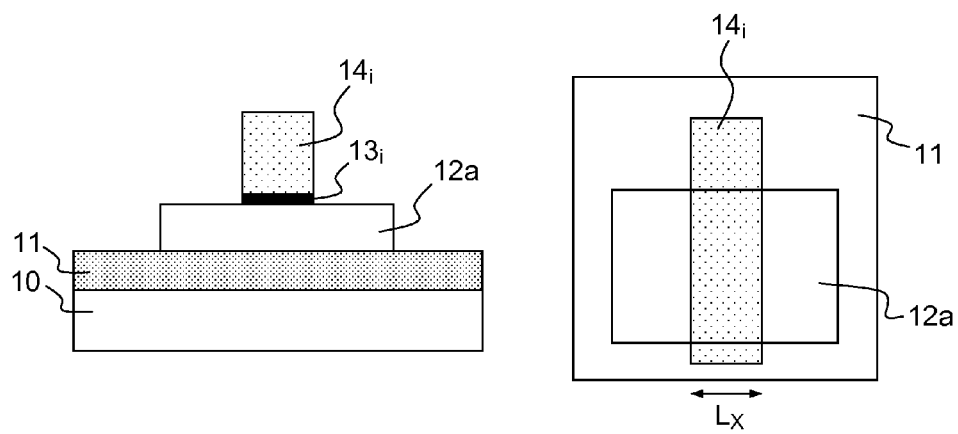

Next, the layers 13 and 14 are etched, as illustrated in FIG. 4d, so as to define primary features 13i, 14i, which will correspond to the apertures in the primary mask. Typically, the dimension $L_x$ of these features may lie between, in conventional technologies, about ten nanometres and ten microns.

Figure 4E:
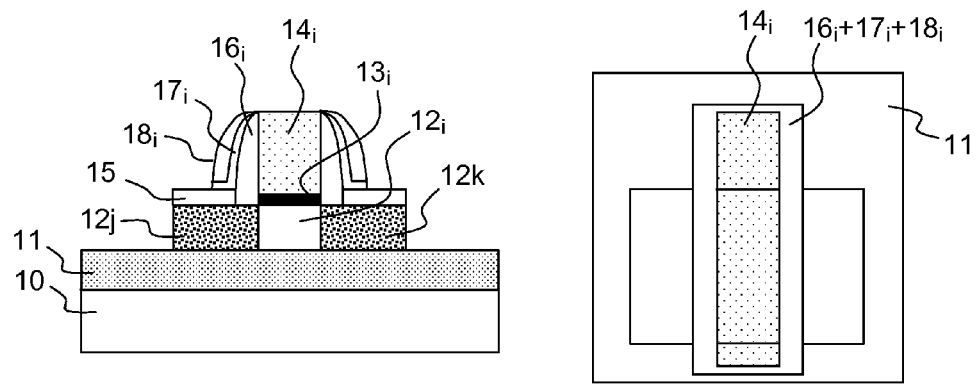

Source 12j and drain 12k regions are produced by implanting dopants in the active region 12a on either side of a region intended to form a channel region 12i, as illustrated in FIG. 4e. Dielectric spacers are produced on either side of the primary features 13i, 14i using a dielectric material possibly a nitride. Advantageously, this may be a combination of a nitride 16i, a tetraethoxysilane ($Si(OC_2H_5)_4$) material 17i also denoted TEOS, and a nitride 18i, as shown in FIG. 4e, the doped regions 12j and 12k possibly being supplemented with an additional more highly doped layer 15.

Figure 4F:
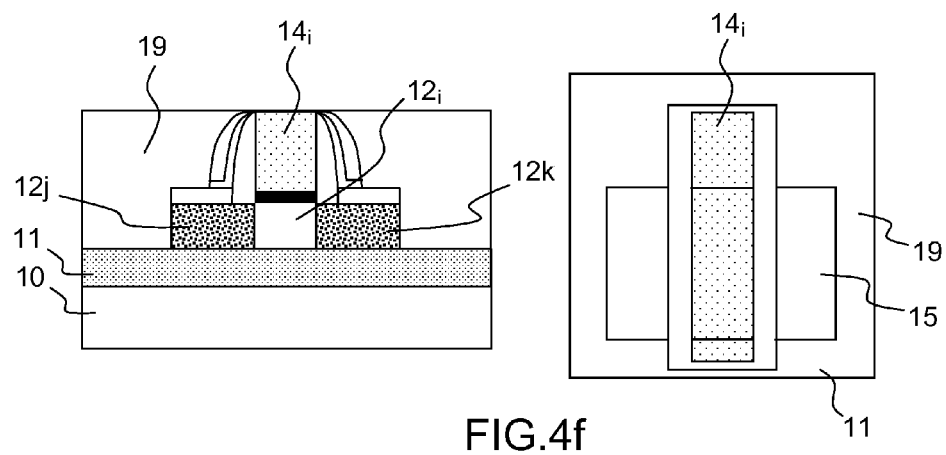

The assembly is covered with a thick dielectric layer 19 as illustrated in FIG. 4f.

Figure 4G:
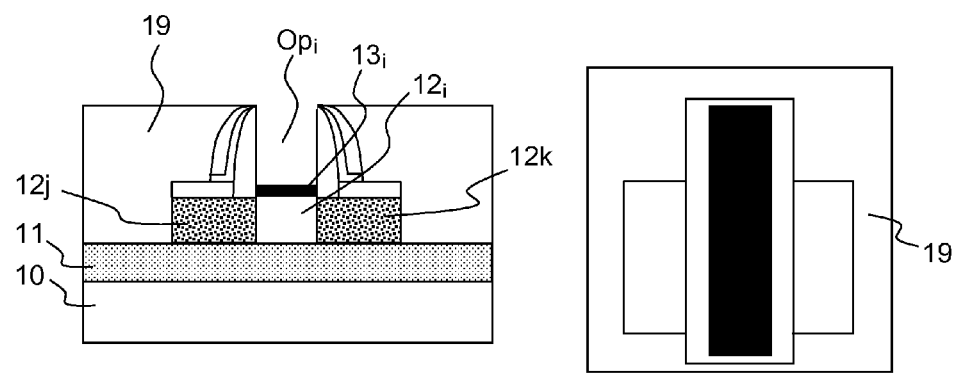

The primary features 14i are selectively removed by etching, for example using a selective chemical etch, selective because of the difference in the etch rate of polysilicon and that of the nitride, so as to define a primary mask containing what are called primary apertures $Op_i$, the etch stopping on the element 13i (or 12i), as shown in FIG. 4g.

Figure 4H:
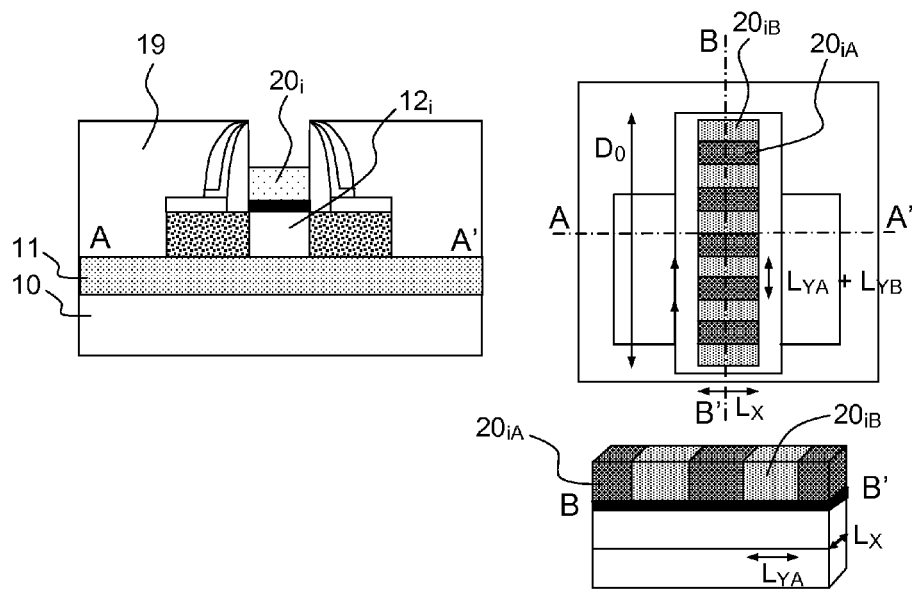

Next, the layer 20i of structured copolymer is deposited, as illustrated in FIG. 4h, in the apertures $Op_i$ produced beforehand. The copolymer layer more precisely consists of blocks $20i_A$ and $20i_B$, as the top view in FIG. 4h shows, the dimensions of the blocks in the Y direction, $L_{YA}$ and $L_{YB}$ are typically about a few tens of nanometres. The distance $D_0$ is thus defined by the equation: $D_0=(n+1)(L_{YA}+L_{YB})/2$.

Figure 4I:
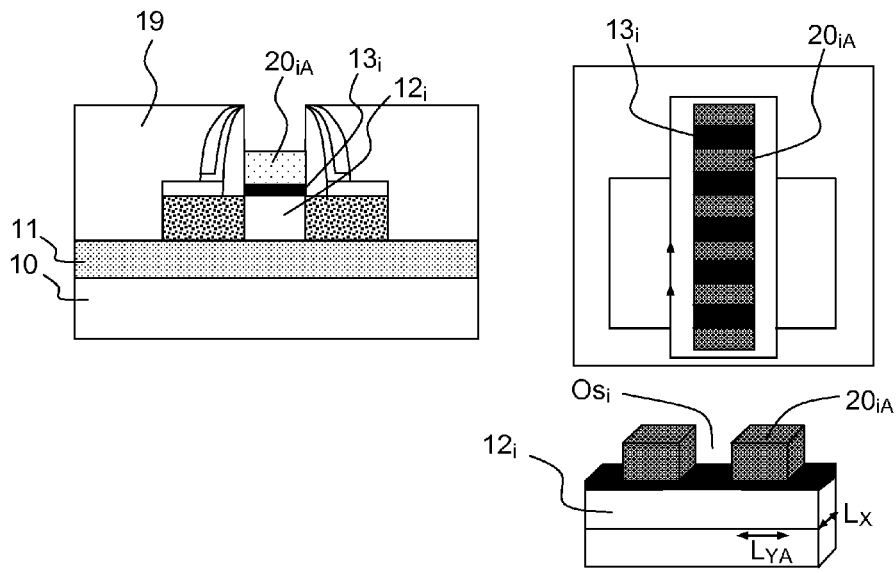

The secondary mask containing secondary apertures $Os_i$ is then produced by removing the series of blocks $20_{iB}$, as shown in FIG. 4i, leaving exposed locally and in alternation elements 13i or 12i and the blocks $20_{iA}$.

Figure 4J:
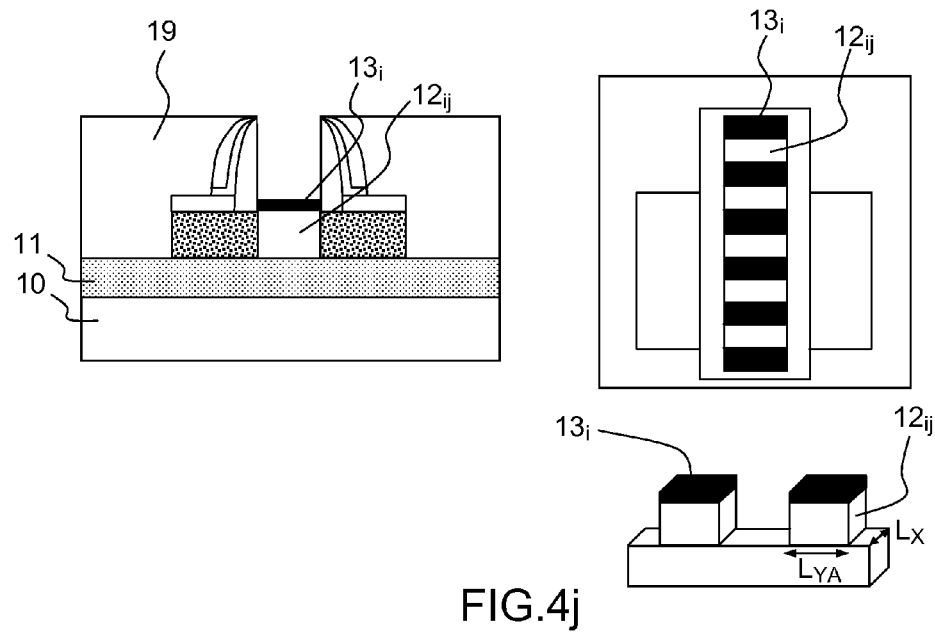

Next, what is called the channel region of the semiconductor layer, and optionally other layers such as 13i that are present, are etched locally so as to define semiconductor features 12ij that have a nanoscale size at least in the Y direction, as shown in FIG. 4j.

Figure 4K:
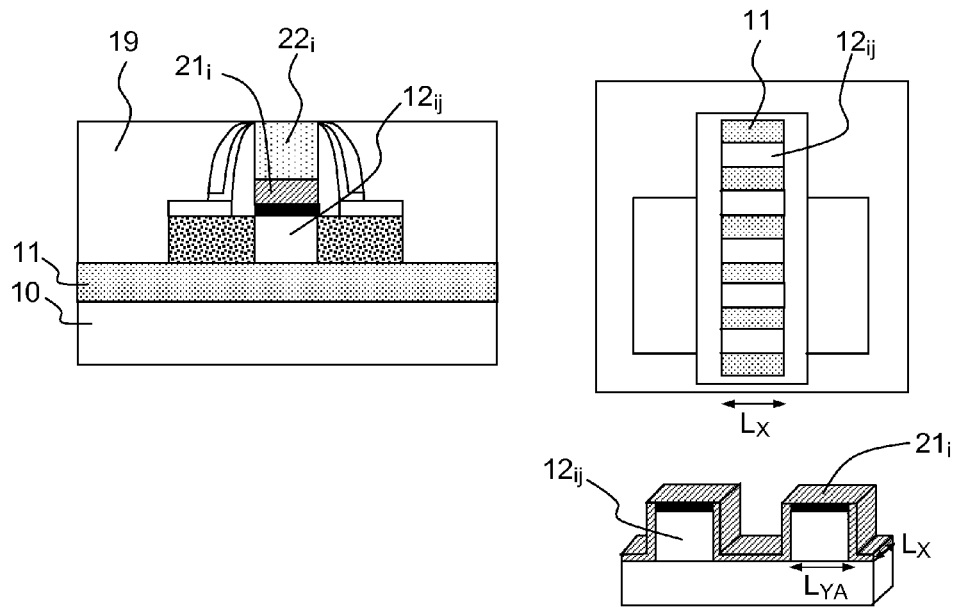

Next, a thin oxide layer is deposited on all of the channel region (under the layer 21i, as shown by the crenellated profile view) this layer may typically be made of $SiO_2$ or $HfO_2$ or any other oxide; then at least one layer of gate metal 21i covered with at least one conductive material 22i, for example a metal or polysilicon, is deposited as shown in FIG. 4k.

Figure 4L:
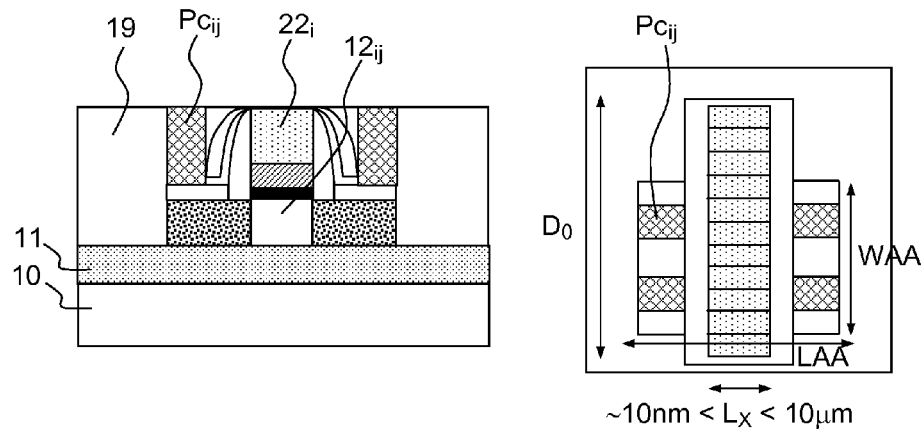
Figure 4M:
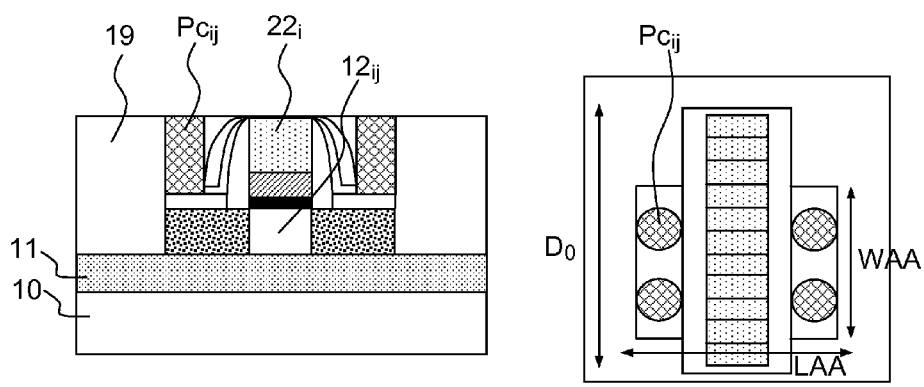

Contacts $Pc_{ij}$ are then produced, as illustrated in FIG. 4l or 4m, allowing the nano-gates thus produced on the semiconductor elements serving as self-aligned nano-channels in the active regions defined by the dimensions $L_{AA}$ and $W_{AA}$ to be controlled. Known techniques may be employed to produce these contact pads, such as described in the literature and notably in the review "Transistor MOS et sa technologie de fabrication" by Thomas Skotnicki, published in the electronics section (traité électronique) of "Les Techniques de l'Ingénieur": Chapter 4.1.10. page 30.

Figure 4N:
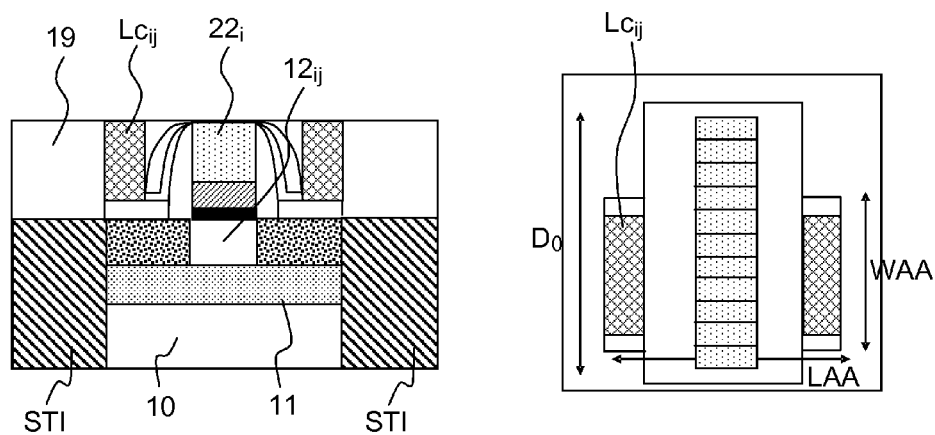

According to one variant illustrated in FIG. 4n, the pads $Pc_{ij}$ may advantageously be replaced with two contact strips $Lc_{ij}$ and the active regions 12a may advantageously be bounded by insulating oxide zones STI commonly called shallow trench isolations using methods known to those skilled in the art.

Figure 5:
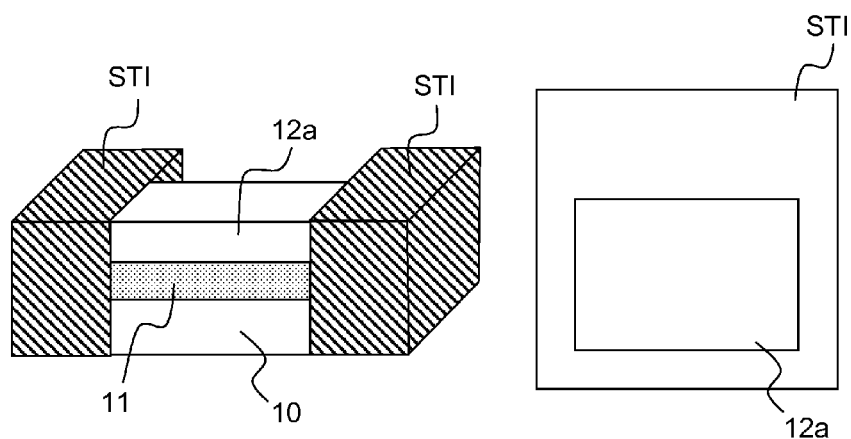
FIG. 5 illustrates a variant of the step for bounding an active region by producing STI zones.
Figure 6:
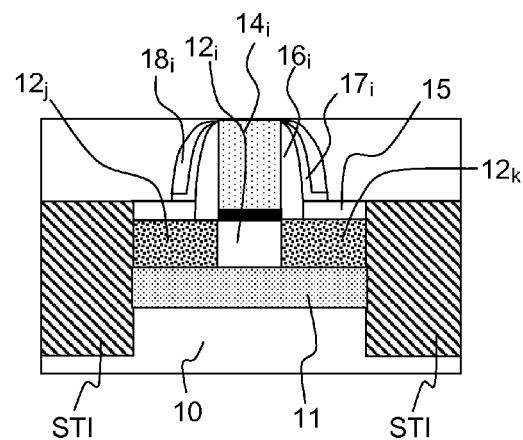
FIG. 6 illustrates a transistor production step comprising the production of the STI elements illustrated in FIG. 5.

The process for producing a transistor described above used etching to define the active regions, as illustrated in FIG. 4b. The active region may equally well be defined by STI oxide trenches, as illustrated in FIG. 5, the depth of the STI zones possibly thus defining regions 12a that are an extension of the layer 11 and the substrate 10. The transistor structure produced in this case is that illustrated in FIG. 6.

Figure 7:
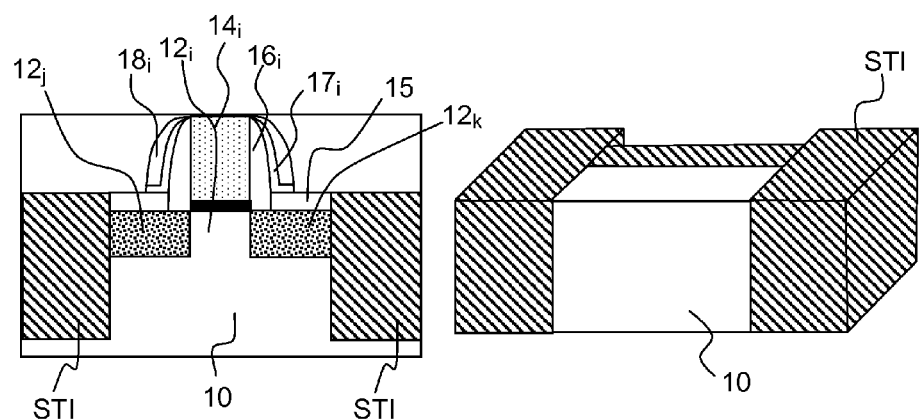
FIG. 7 illustrates a variant transistor that does not comprise a buried oxide layer.

The preceding description of an example of a transistor relates to an FDSOI transistor, another example of a transistor to which the invention can equally well apply is illustrated by a cross-sectional view in FIG. 7, and directly comprises an active region defined in the silicon substrate 10. In this example the active region is also bounded by STI elements.

The invention claimed is:

1. A process for fabricating at least one transistor comprising an active semiconductor region on or in a substrate, said active semiconductor region comprising a source region, a drain region, and a channel region covered with a gate, the process comprising:
producing a primary etching mask on a surface of said active semiconductor region, said primary etching mask containing at least one primary aperture of dimensions $L_x$ and $L_y$, in a XY plane parallel to a plane of said active semiconductor region, wherein the XY plane is defined by a first direction X and a second direction Y;
depositing in said primary aperture a block copolymer containing, in alternation, at least first polymer domains and second polymer domains, said first and second polymer domains having dimensions $L_x$ and $L_{yA}$ and $L_x$ and $L_{yB}$, respectively, the dimensions $L_{yA}$ and $L_{yB}$ being nanoscale dimensions;
removing either a series of first polymer domains or a series of second polymer domains in order to create a secondary mask containing secondary apertures distributed in the second direction Y;
etching said active semiconductor region through said secondary apertures in order to define nanoscale self-aligned semiconductor features of dimensions $L_x$ and $L_{yA}$ or $L_x$ and $L_{yB}$ in the channel region in the second direction Y, said nanoscale self-aligned semiconductor features being distributed along the second direction Y; and
producing said gate on a surface of said nanoscale self-aligned semiconductor features,
wherein the transistor is configured to flow a current between the source region and the drain region in the first direction X.

2. The process for fabricating at least one transistor according to claim 1, in which said producing the primary etching mask further comprises the following steps:
producing at least one primary feature on the surface of said active semiconductor region;
producing dielectric spacers making contact with said primary feature; and
removing said primary feature with an etch that is selective over said dielectric spacers, said dielectric spacers defining said primary etching mask containing said at least said primary aperture.

3. The process for fabricating at least one transistor according to claim 1, in which the active semiconductor region is made of silicon, or of silicon-germanium, or of germanium, or of a III-V material that is possibly InGaAs or InAs.

4. The process for fabricating at least one transistor according to claim 1, in which the active semiconductor region is produced in a semiconductor layer that is possibly made of silicon, located on a surface of an oxide layer on a surface of the substrate that is possibly made of silicon.

5. The process for fabricating at least one-transistor according to claim 1, in which the active semiconductor region is produced in a bulk semiconductor substrate.

6. The process for fabricating at least one transistor according to claim 1, in which the copolymer is a diblock copolymer composed of polystyrene (PS) and polymethyl methacrylate (PMMA).

7. The process for fabricating at least one transistor according to claim 1, further comprising depositing one or more gate oxides, one gate oxide of which may be deposited conformally on said semiconductor features.

8. The process for fabricating at least one transistor according to claim 7, further comprising depositing a metal gate layer on the gate, on said self-aligned semiconductor features in the channel region.

9. The process for fabricating at least one transistor according to claim 8, further comprising depositing a thick conductive material, possibly a metal or polysilicon, on the surface of said metal gate layer.

10. The process for fabricating at least one transistor according to claim 1, further comprising:
    depositing gate oxide on said active semiconductor region in line with said channel region;
    producing at least one primary feature on the surface of said active semiconductor region;
    producing dielectric spacers making contact with said primary feature; and
    removing said primary feature with an etch that is selective over the dielectric spacers, said dielectric spacers defining said primary mask containing at least one primary aperture, said primary aperture being located above said gate oxide.

11. The process for fabricating at least one transistor according to claim 10, further comprising removing said gate oxide and subsequently depositing a conformal gate oxide on said self-aligned semiconductor features.

12. The process for fabricating at least one transistor according to claim 1, further comprising configuring said active semiconductor region to determine the source region, channel region and drain region taken together, by etching a bulk semiconductor substrate or a semiconductor layer on a surface of an oxide layer on a surface of a substrate.

13. The process for fabricating at least one transistor according to claim 1, further comprising producing zones of insulating material in order to define said active semiconductor region comprising the source region, the drain region and said nanoscale self-aligned semiconductor features in a semiconductor substrate or in a semiconductor layer on a surface of an oxide layer on a surface of a substrate.

14. The process for fabricating at least one transistor according to claim 1, wherein said said nanoscale self-aligned semiconductor features are removed by chemical etching.

15. The process for fabricating at least one transistor according to claim 1, further comprising depositing a layer of insulating material coating the source region, the drain region and the covered self-aligned semiconductor features.

16. The process for fabricating at least one transistor according to claim 15, further comprising producing a series of individual electrical contact pads or a linear electrical contact array through said layer of insulating material, said contact pads or said linear contact array allowing contact to be made to the sources and drains and said self-aligned semiconductor features to be controlled.

* * * * *